United States Patent [19]

Rabe

[11] 4,449,245

[45] May 15, 1984

[54] HIGH GAIN BALANCED MIXER

[75] Inventor: Duane C. Rabe, Rolling Meadows, Ill.

[73] Assignee: Motorola Inc., Schaumburg, Ill.

[21] Appl. No.: 360,511

[22] Filed: Mar. 22, 1982

[51] Int. Cl.³ ............................................. H04B 1/26
[52] U.S. Cl. .................................. 455/319; 455/317; 455/326; 455/332; 455/333; 332/43 B
[58] Field of Search ............... 455/302, 317, 326, 330, 455/332, 333, 318, 319; 332/24, 43 B

[56] References Cited

U.S. PATENT DOCUMENTS

| 2,760,061 | 8/1956 | Pan et al. | |
| 3,383,601 | 5/1968 | Squires | 455/333 |
| 3,469,212 | 9/1969 | Karl et al. | 332/43 B |
| 3,727,078 | 4/1973 | Wollesen | |
| 3,939,430 | 2/1976 | Dickens et al. | |
| 4,317,230 | 2/1982 | Boubouleix | 455/333 |

OTHER PUBLICATIONS

"Junction FETs in Active Double-Balanced Mixers" by Ed Oxner, Jun. 1973 (Siliconix Inc.-Application Note), pp. 1 and 2.
"FETs in Balanced Mixers" by Ed Oxner, Jul. 1972 (Siliconix, Inc. Application Note), pp. 1-15.

Primary Examiner—Jin F. Ng
Attorney, Agent, or Firm—F. John Motsinger; James W. Gillman

[57] ABSTRACT

An improved active balanced mixer for developing an IF signal by combining an RF signal and a local oscillator signal while providing high conversion gain. The mixer utilizes a series resonant circuit resonant at the IF frequency to reduce degenerative feedback effects at the IF frequency, thereby increasing conversion gain. Circuit is particularly adapted for a receiver in which the received RF signal is relatively close to the receivers IF frequency.

5 Claims, 2 Drawing Figures

HIGH GAIN BALANCED MIXER

BACKGROUND OF THE INVENTION

1. Field of the Invention

This invention relates generally to the radio-frequency signal mixing art and in particular to an improved balanced mixer with high conversion gain.

2. Description of the Prior Art

A mixer is a three port, time varying network which translates an RF signal at one frequency to some other intermediate frequency. To affect this translation, the RF signal is heterodyned or mixed in a non linear device with another RF signal from a local oscillator. This process generates two primary sidebands which are equal to the sum and difference between the two RF signal frequencies.

The usual method of suppressing one of the input signal components to a mixer, is to employ a balanced mixer which utilizes two nearly identical non-linear devices. However, balanced passive mixers suffer from conversion loss and must be preceded by an expensive RF amplifier. The need for an RF amplifier may be eliminated by utilizing active devices such as field effect transistors or bipolar transistors in place of the passive devices. However, in prior art active balanced mixers, substantial conversion gain is lost due to degenerative feedback effects especially whenever the received RF signal frequency is relatively close to the receivers IF frequency.

SUMMARY OF THE INVENTION

It is an object of the invention, therefore, to provide an improved active balanced mixer with high conversion gain.

It is another object of the invention, to provide an active balanced mixer particularly adapted to obtain high conversion gain in a receiver wherein the RF signal frequency and the IF signal frequency are relatively close together.

It is yet another object of the invention to provide an active balanced mixer utilizing a series resonant circuit, resonant at the desired IF signal frequency, coupled across the inputs of the active devices of the mixer to provide increased conversion gain.

Briefly, according to the invention, an active balanced mixer is provided for mixing a first RF signal with a second RF signal of different frequency and having at least two non-linear active devices each having an input and an output. Each active device has a control terminal coupled to the control terminal of at least one other of the active devices and the active devices are operatively coupled to produce a differential IF difference frequency. The balanced mixer includes an input circuit, coupled to the active devices, for a differentially phase splitting the first RF signal and coupling the differentially phase split signal to the active devices. An output combining circuit combines the differential IF difference frequency to provide a single ended IF output. A resonant circuit, resonant at the IF frequency and coupled to the inputs of the active devices, provides a resonant low impedance at the IF frequency between the inputs of the active devices.

BRIEF DESCRIPTION OF THE DRAWINGS

The features of the present invention which are believed to be novel are set forth with particularity in the appended claims. The invention, together with further objects and advantages thereof, may best be understood by reference to the following description when taken in conjunction with the accompanying drawings.

DETAILED DESCRIPTION OF THE PREFERRED EMBODIMENT

Figure 1:
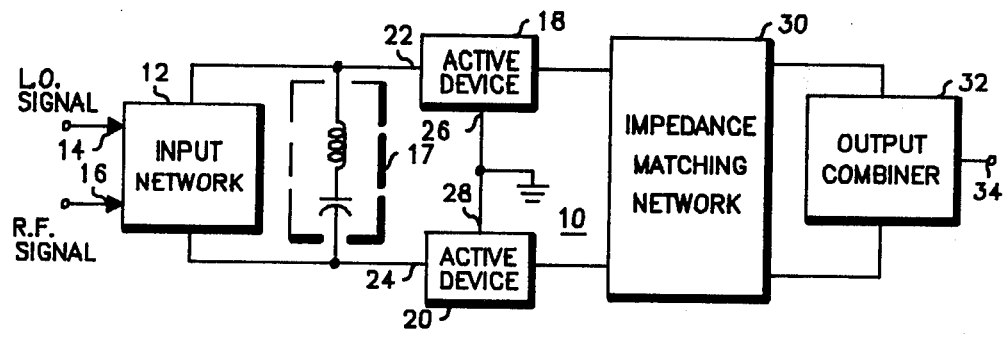
FIG. 1 is a generalized block diagram of a balanced mixer according to the invention.

In FIG. 1 there is illustrated a generalized block diagram of an active balanced mixer 10, according to the invention. A local oscillator signal (L.O.) is applied to the local oscillator input 14 of an input network 12 and a received RF signal is coupled to the RF input 16 of the input network 12. The input network 12 differentially phase splits one of the two input signals and combines the phase split signal with the second input signal to provide combined signals on its outputs which are coupled as shown, to the inputs 22, 24 of the active devices 18, 20. The control terminals 26, 28 of the active devices 18,20 are coupled, as shown, to ground. An alternative configuration would permit one of the input signals to be applied to the junction of the control terminals 26, 28 instead of grounding, with the other input signal still applied to the input network. At the output terminals of the active devices 18, 20 a differential difference signal is produced and coupled to an impedance matching network 30 as shown. The impedance matching network 30 is an optional circuit which provides impedance transformation, matching the impedance of the mixer output to the IF circuits, thereby permitting higher conversion gain. The differential difference IF signal is coupled from the impedance matching network 30 to the output combiner 32 which combines the differential difference signal at the predetermined IF frequency, providing an IF output at the output terminal 34.

In the preferred embodiment, the mixer 10 is adapted for use in an RF receiver operative on a plurality of radio channels at an RF frequency of approximately 160 MHz and with an IF frequency of 53.9 MHz. Under these conditions, wherein the received RF signal frequency is relatively close to the IF signal frequency (i.e., within approximately a factor of 10) the conversion gain of the active balanced mixer 10 is ordinarily very low due to degenerative feedback effects caused by the impedance of the input network 12. This problem is substantially eliminated in the inventive mixer 10 by a series resonant circuit 17 which is coupled, as shown, between the input terminals 22, 24 of the active devices 18, 20. The resonant circuit 17 is made resonant at the predetermined IF frequency, thereby providing a low impedance path between the terminals 22, 24 of the active devices 18,20 at the IF frequency. This greatly reduces the degenerative feedback effect and results in substantially higher conversion gain.

Figure 2:
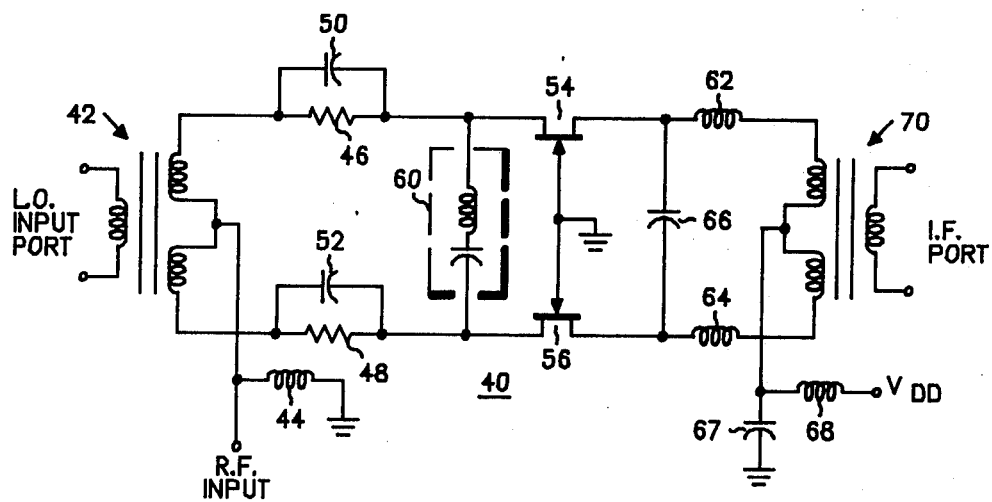
FIG. 2 is a detailed schematic diagram of the preferred embodiment of the invention.

Referring now to FIG. 2, there is shown a detailed schematic diagram of the preferred embodiment of the inventive active balanced mixer 40. A local oscillator signal is coupled to the primary of the transformer 42 and an RF signal is coupled to the center tap of the secondary of the transformer 42 as shown. An inductor 44 is coupled, as shown, to serve as an RF choke. The RF transformer differentially phase splits the local oscillator signal and combines the phase split signal with the RF signal, generating combined signals at the ends of the secondary which are coupled as shown to the bias resistors 46, 48. The capacitors 50, 52 are coupled as shown, across the resistors 46, 48 to serve as bypass capacitors. The signals are coupled from the transformer 42, to the sources of the field effect transistors 54, 56 which are configured with their gates connected to ground, as shown. In addition, a series resonance circuit 60, resonant at or near the desired IF signal frequency, is coupled between the sources of the transistors 54, 56, as shown. This resonant circuit provides a low impedance path between the transistor sources at the IF signal frequency thereby providing improved conversion gain by reducing degenerative feedback. The combined signal applied to the transistors 54, 56 results in differential difference signals at the drains which are coupled through a matching circuit, composed of inductors 62, 64 and a capacitor 66, to a transformer 70. The center tap of the primary of the transformer 70 is coupled, as shown, to a supply voltage $V_{DD}$ through a choke 68 and to ground through a capacitor 67. The transformer 70 acts as a signal combiner producing a single ended output signal at the IF signal frequency at the secondary output.

In summary, an improved active balanced mixer having high conversion gain, suitable for use in a radio receiver has been described. The mixer is particularly adapted for receivers in which the received RF signal frequency is relatively close to the receivers IF signal frequency.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. An active balanced mixer for producing a predetermined IF signal, including at least two non-linear active devices with each non-linear active device having an input terminal, an output terminal and a control terminal coupled to the control terminal of at least one other of the active non-linear devices, said active balanced mixer comprising:

input means, coupled to the non-linear active devices, for differentially phase splitting into two signals a first RF signal coupled to the input means, and for coupling the two differential phase split signals respectively to the inputs of the non-linear active devices, said non-linear active devices mix the differential phase split signals with a second RF signal for producing differential IF signals at said output terminals;

output combining means, coupled to the output terminals of the non-linear active devices, for combining the differential IF signals to provide a single ended output;

resonant circuit means, resonant at the IF signal frequency and coupled to the inputs of said active devices, for providing a resonant low impedance at the IF frequency.

2. An active balanced mixer circuit according to claim 1 wherein each active device is a field effect transistor with the source as the input terminal, the gate as the control terminal, and the drain as the output terminal.

3. An active balanced mixer circuit according to claim 1 further comprising an impedance matching means, coupled to the active devices and to the output combining means, for providing impedance matching to the output thereby increasing the conversion gain of the balanced mixer.

4. An active balanced mixer circuit according to claim 3 wherein each active device is a field effect transistor with the source as the input terminal, the gate as the control terminal and the drain as the output terminal.

5. An active balanced mixer circuit according to claim 1 or 3 wherein the input means differentially phase splits the first RF signal, combines the phase split signal with the second RF signal and couples the combined signals to the active devices.

* * * * *